United States Patent
Chu et al.

[19]

[11] Patent Number: 6,117,732
[45] Date of Patent: Sep. 12, 2000

[54] USE OF A METAL CONTACT STRUCTURE TO INCREASE CONTROL GATE COUPLING CAPACITANCE FOR A SINGLE POLYSILICON NON-VOLATILE MEMORY CELL

[75] Inventors: Wen-Ting Chu, Kaoshiung; Chuan-Li Chang, Hsin-Chu; Ming-Chou Ho, Taichung; Chang-Song Lin, Hsin-Chu; Di-Son Kuo, Hsinchu, all of Taiwan

[73] Assignee: Taiwan Semiconductor Manufacturing Co., Hsin-Chu, Taiwan

[21] Appl. No.: 09/193,671

[22] Filed: Nov. 17, 1998

[51] Int. Cl.[7] .................................................. H01L 21/8247
[52] U.S. Cl. .......................... 438/264; 438/594; 257/318
[58] Field of Search .................................... 438/257–267, 438/593–594; 257/316, 318

[56] References Cited

U.S. PATENT DOCUMENTS

| | | | |
|---|---|---|---|
| 4,924,278 | 5/1990 | Logie | 357/23.5 |
| 5,042,008 | 8/1991 | Iwasa et al. | 365/185 |
| 5,376,572 | 12/1994 | Yang et al. | |
| 5,389,567 | 2/1995 | Acovic et al. | |
| 5,576,569 | 11/1996 | Yang et al. | 257/321 |
| 5,761,121 | 6/1998 | Chang | 365/185.14 |
| 5,768,186 | 6/1998 | Ma | 365/185.01 |
| 5,837,583 | 11/1998 | Chuang et al. | 438/257 |
| 5,981,993 | 11/1999 | Cho | 257/311 |

*Primary Examiner*—Richard Booth
*Attorney, Agent, or Firm*—George O. Saile; Stephen B. Ackerman

[57] ABSTRACT

A method for fabricating a single polysilicon, non-volatile memory device, has been developed. The method features the use of a metal structure, comprised to contact an underlying control gate region, located in the semiconductor structure, in addition to providing the upper electrode, for a capacitor structure. The capacitor structure, in addition to the metal structure used as the upper electrode, is also comprised of an underlying capacitor dielectric layer, and an underlying polysilicon floating gate structure, used as the lower electrode of the capacitor structure. The creation of the capacitor structure results in performance increases realized via the additional control gate coupling capacitance, obtained via the novel configuration described in this invention.

19 Claims, 3 Drawing Sheets

USE OF A METAL CONTACT STRUCTURE TO INCREASE CONTROL GATE COUPLING CAPACITANCE FOR A SINGLE POLYSILICON NON-VOLATILE MEMORY CELL

BACKGROUND OF THE INVENTION (1) Field of the Invention

The present invention relates to a method of fabricating a non-volatile memory device, on a semiconductor substrate, and more specifically to a process used to create a metal contact to a control gate region, of the non-volatile memory device, and to use the same metal contact to create a metal-polysilicon capacitor structure, to increase control gate coupling capacitance.

(2) Description of the Prior Art

The semiconductor industry has been creating non-volatile memory devices, and memory cells, using a double polysilicon configuration. The first polysilicon layer is used as a floating gate, located overlying a thin insulator layer, that is used as the tunnel oxide of the non-volatile memory device. The second polysilicon layer is used for the control gate, with the second polysilicon layer also used as a wordline, sometimes traversing a long row of array devices. The high resistance of the long polysilicon line, compared to metal counterparts, can result in wordline RC time delays, adversely influencing device or cell performance, thus the trend to single polysilicon, non-volatile memory devices, became prevalent in the semiconductor industry. The single polysilicon, non-volatile memory device is comprised of a polysilicon floating gate structure, and a doped region in the semiconductor substrate, used for the control gate. However for performance considerations, the coupling capacitance of the single polysilicon, non-volatile memory device, has to be maximized. This is sometimes accomplished by increasing the dimensions of the control gate, or doped region in the semiconductor, however this design consumes more area than desired, adversely influencing chip density and cost.

This invention will offer a solution to the coupling capacitance concerns, inherent in conventional single polysilicon, non-volatile memory devices. A metal contact structure, is configured to serve as a direct contact to the control gate region, while also configured to be used as a top plate of a capacitor structure, comprised of the overlying metal contact structure, and dielectric layer which resides on the top surface of the underlying polysilicon floating gate structure. The metal contact configuration, described in this invention, increases the control gate coupling ratio, without increasing the dimension of the single polysilicon, non-volatile memory device, thus positively influencing device performance, without consuming additional area. Prior art, such as Logie, in U.S. Pat. No. 4,924,278, and Chang, in U.S. Pat. No. 5,761,121, describe a process for fabricating a single polysilicon, non-volatile memory device, however these prior arts do not disclose the use of a metal contact structure, to a control gate region, in the semiconductor substrate, and also used as a component of a capacitor structure, used to increase the coupling capacitance of the device.

SUMMARY OF THE INVENTION

It is an object of this invention to fabricate a single polysilicon, non-volatile memory device.

It is another object of this invention to use a metal contact structure, to contact a doped region, in the semiconductor substrate, used for the control gate of the non-volatile memory device.

It is still another object of this invention to use the same metal contact structure, used to contact the control gate region, as a component of a capacitor structure, used to increase the coupling capacitance of the non-volatile memory device.

In accordance with the present invention, a process is described for fabricating a single polysilicon, non-volatile memory device, featuring a metal contact structure, used to contact an underlying control gate region, in the semiconductor substrate, and also used as the top plate, of a capacitor structure, used to increase the control gate coupling capacitance of the non-volatile memory device. After the creation of insulator filled, shallow trench isolation regions, N+ regions are formed in areas of the semiconductor substrate, not consumed by the isolation regions. A thin tunnel oxide layer is formed on the top surface of a portion of a first N+ region, followed by the creation of a polysilicon floating structure, overlying the thin tunnel oxide layer. A capacitor opening, in an overlying interlevel dielectric layer, is then created, exposing a portion of the top surface of the polysilicon floating gate structure. A capacitor dielectric layer is next formed, overlying the portion of the polysilicon floating gate structure, exposed in the capacitor opening. A contact hole is next opened in the insulator layers, exposing a portion of a second N+ region, where the second N+ region is used as the control gate region of the non-volatile memory device. A metal structure is formed, with a first portion of the metal structure, overlying and contacting, the portion of the control gate region, exposed in the contact hole. The second portion of the metal structure, located overlying the capacitor dielectric layer, exposed in the capacitor opening, forms a capacitor structure comprised of the metal structure, on the capacitor dielectric layer, which in turn resides on the underlying polysilicon floating gate structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
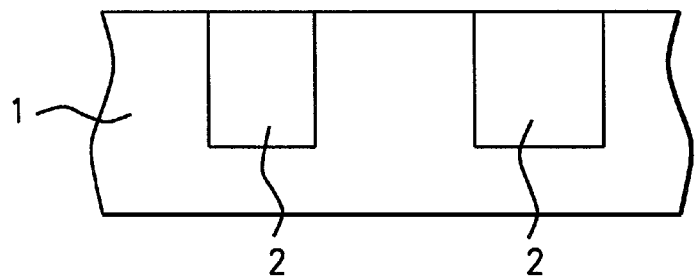
FIGS. 1–7, which schematically, in cross-sectional style, describe the process used to fabricate a single polysilicon, non-volatile memory device, featuring a metal structure, used for contact to the control gate region, and used as a component of a capacitor structure, used to increase the coupling capacitance of the non-volatile memory device.

The process used to fabricate a single polysilicon, non-volatile memory device, featuring a metal structure, used to provide contact to an underlying control gate region, in the semiconductor substrate, and also used as a upper electrode, for a capacitor structure, needed to provide additional coupling capacitance for the single polysilicon, non-volatile memory device, will now be described in detail. A P type, single crystalline, semiconductor substrate 1, exhibiting a <100> crystallographic orientation, is used, and schematically shown in FIG. 1. Isolation regions 2, are created using shallow trench isolation, (STI), or if desired thermally grown, field oxide, (FOX), regions. STI regions 2, are formed via initially creating a shallow trench, in semiconductor substrate 1, via conventional photolithographic and anisotropic reactive ion etching, (RIE), procedures, using $Cl_2$ as an etchant. The shallow trench is created to a depth between about 2000 to 6000 Angstroms, in semiconductor substrate 1. After removal of the photoresist shape, used for shallow trench definition, via plasma oxygen ashing and careful wet cleans, a silicon oxide layer is deposited, via low pressure chemical vapor deposition, (LPCVD), or plasma enhanced chemical vapor deposition, (PECVD), procedures, to a thickness between about 3000 to 15000 Angstroms, completely filling the shallow trenches. Removal of the silicon oxide, from regions other than inside the shallow trenches, is accomplished using either a chemical mechanical polishing, (CMP), procedures, or via a selective RIE procedure, using $CHF_1$ as an etchant, resulting in insulator filled, STI regions 2, schematically shown in FIG. 1. The FOX isolation regions, would be formed via initially forming an oxidation resistant mask, such as silicon nitride, then exposing regions of the semiconductor substrate, not protected by the silicon nitride masking pattern, to a thermal oxidation procedure, creating FOX regions, at a thickness equal to the depth of STI regions 2. After formation of the FOX region, the oxidation resistant mask is removed.

Figure 2:
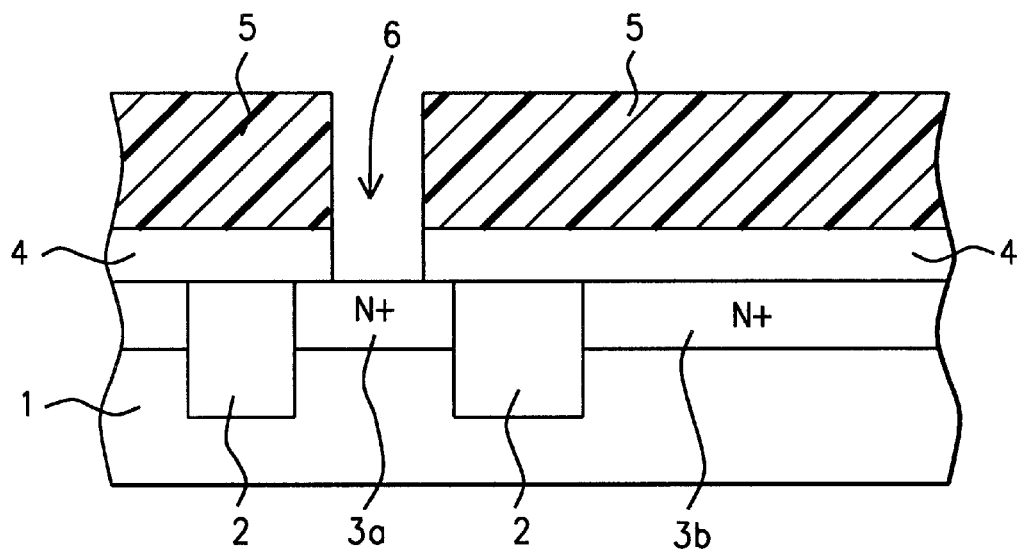

Heavily doped, N+ regions, 3a, and 3b, are next formed in regions of semiconductor substrate 1, not occupied by STI regions 2. The heavily doped, N+ regions are formed via an ion implantation of arsenic or phosphorous ions, at an energy between about 10 to 100 KeV, and at a dose between about 1E14 to 1E16 atoms/$cm^2$. Heavily doped, N+ region 3b, shown schematically in FIG. 2, will be used for the control gate of the single polysilicon, non-volatile memory device. Silicon oxide layer 4, is next thermally grown, in an oxygen steam ambient, to a thickness between about 50 to 300 Angstroms. Photoresist shape 5, is then used as a mask, to allow a wet buffered hydrofluoric acid dip, to create opening 6, in silicon oxide layer 4, exposing a portion of heavily doped, N+ region 3a. This is schematically shown in FIG. 2.

Figure 3:
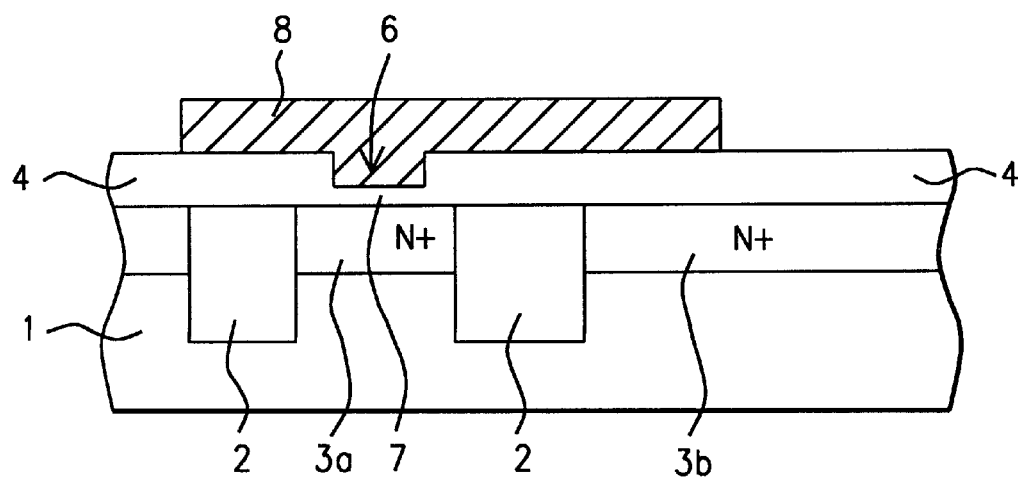

After removal of photoresist shape 5, via plasma oxygen ashing and careful wet cleans, tunnel oxide layer 7, comprised of silicon dioxide, is thermally grown on the area of heavily doped, N+ region 3a, exposed in opening 6. Tunnel oxide layer 7, schematically shown in FIG. 3, is thermally grown, in an oxygen-steam ambient, at a temperature between about 600 to 1000° C., to a thickness between about 60 to 150 Angstroms. A polysilicon layer is next deposited, via LPCVD procedures, to a thickness between about 500 to 4000 Angstroms. Doping of the polysilicon layer is either accomplished in situ, during deposition, via the addition of arsine or phosphine, to a silane ambient, or via an ion implantation procedure, using arsenic or phosphorous ions, applied to an intrinsically deposited polysilicon layer. Conventional photolithographic and RIE procedures, using $Cl_2$ as an etchant, are used to pattern the polysilicon layer, creating polysilicon floating gate 8, schematically shown in FIG. 3. Removal of the photoresist shape, used for definition of polysilicon floating gate 8, is performed via plasma oxygen ashing and careful wet cleans.

Figure 4:
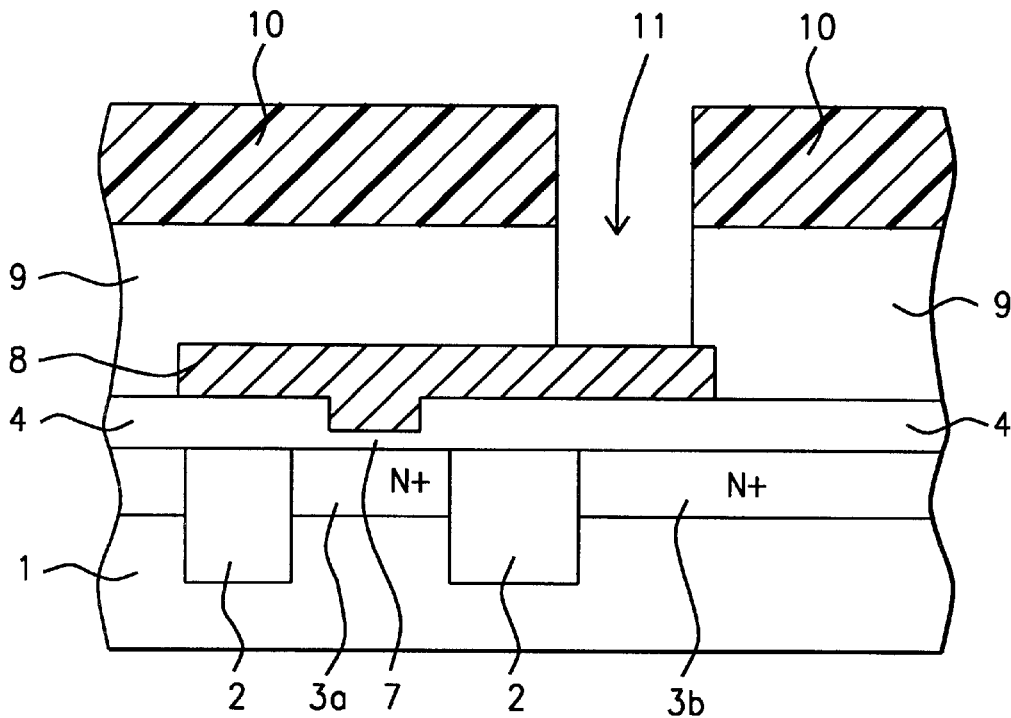
Figure 5:
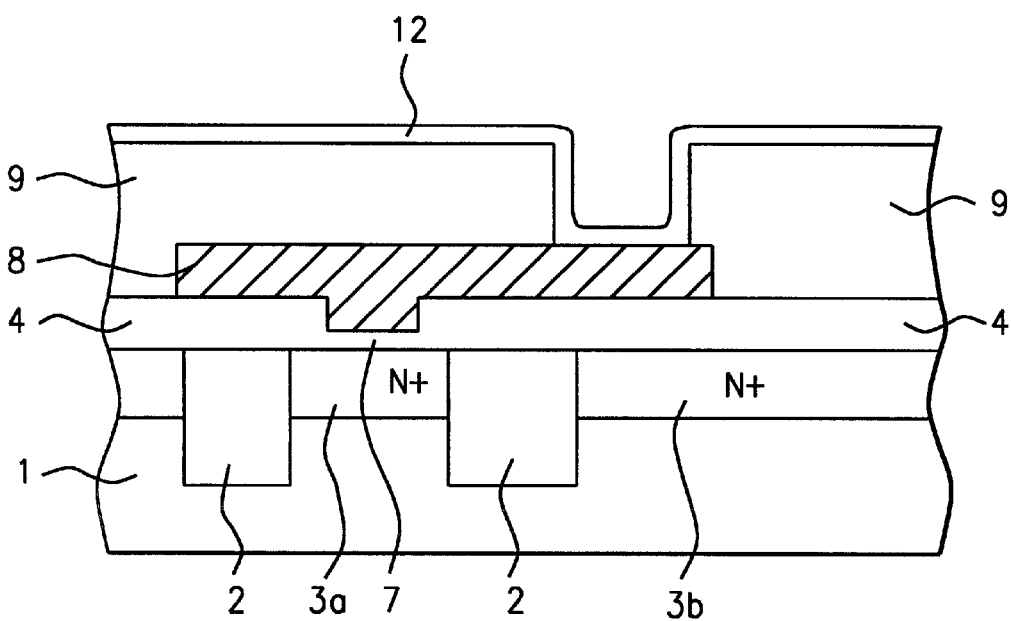

An interlevel dielectric, (ILD), layer 9, comprised of silicon oxide, is next deposited via LPCVD or PECVD procedures, to a thickness between about 3000 to 15000 Angstroms. Photoresist shape 10, is then used as a mask, to allow an anisotropic RIE procedure, using $CHF_3$ as an etchant, to create capacitor opening 11, in ILD layer 9. Capacitor opening 11, shown schematically in FIG. 4, exposes a portion of the top surface of polysilicon floating gate 8. After removal of photoresist shape 10, via plasma oxygen ashing and careful wet cleans, capacitor dielectric layer 12, is formed. Capacitor dielectric layer 12, shown schematically in FIG. 5, can be silicon oxide, or an ONO, (oxidized silicon nitride on oxide) layer, formed at a thickness between about 100 to 1000 Angstroms.

Figure 6:
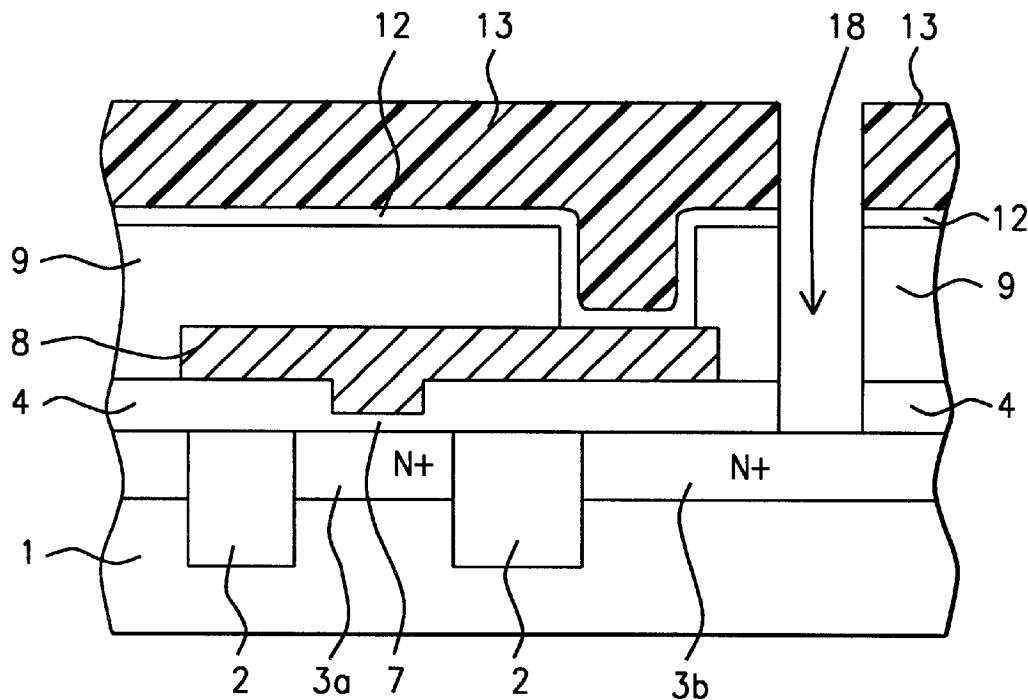
Figure 7:
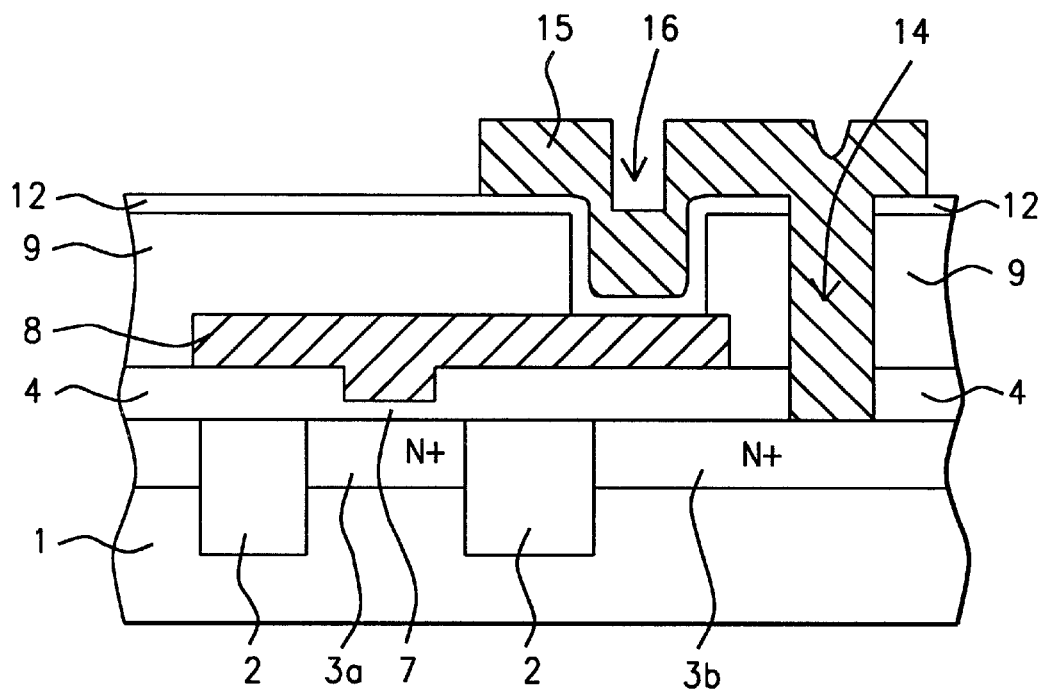

Photoresist shape 13, is next used as a mask, to allow an anisotropic RIE procedure, using $CHF_3$ as an etchant, to create contact hole 14, in capacitor dielectric layer 12, and in ILD layer 9, and in silicon oxide layer 4. Contact hole 14, schematically shown in FIG. 6, exposes a portion of the top surface of control gate region 3b. After removal of photoresist shape 13, once again using plasma oxygen ashing and careful wet cleans, a metal layer is deposited. The metal layer can be an aluminum based layer, obtained via R.F. sputtering, at a thickness between about 3000 to 10000 Angstroms, containing between about 0 to 3 weight % copper, and between about 0 to 1 weight % silicon. If desired the metal layer can also be a tungsten layer, or a tungsten silicide layer, both obtained via LPCVD procedures, again at a thickness between about 3000 to 15000 Angstroms. A photoresist shape is then used as a mask, to allow an anisotropic RIE procedure, using $Cl_2$ as an etchant, to pattern the metal layer, creating metal structure 15, schematically shown in FIG. 7. A first portion of metal structure 15, provides contact to control gate region 3b, while a second portion, of metal structure 15, is used as the top, or upper plate, of capacitor structure 16, comprised of: upper plate, (metal structure 15); capacitor dielectric layer 12; and lower plate, (polysilicon floating gate 8). Removal of the photoresist shape, used to define capacitor structure 16, is accomplished via plasma oxygen ashing and careful wet cleans.

The emergence of capacitor structure 16, results in desired additional capacitance for the control gate, which without the use of the capacitor structure, could only be obtained via a larger control gate region, which would adversely influence device density, and cost. The additional capacitance, offered via capacitor structure 16, also increases the control gate coupling capacitance, of the single polysilicon, non-volatile memory device, and thus improves device performance.

While this invention has been particularly shown and described with reference to, the preferred embodiments thereof, it will be understood by those skilled in the art that various changes in form and detail may be made without departing from the spirit and scope of this invention.

What is claimed is:

1. A method of forming a memory device, on a semiconductor substrate, comprising the steps of:

providing a first doped region, and a second doped region, in areas of said semiconductor substrate, not occupied by insulator isolation regions;

forming a first opening, in a first insulator layer, exposing a portion of the top surface of said first doped region;

forming a tunnel oxide layer, on the portion of the top surface of said first doped region, exposed in said first opening in said first insulator layer;

forming a polysilicon floating gate structure, completely overlying said tunnel oxide layer, and overlying a portion of said first insulator layer;

depositing a second insulator layer;

forming a second opening, in said second insulator layer, exposing a portion of the top surface of said polysilicon floating gate structure;

forming a thin dielectric layer on the surface of said second insulator layer, and on the portion of the top surface of said polysilicon floating gate structure, exposed in said second opening;

forming a third opening in said thin dielectric layer, in said second insulator layer, and in said first insulator layer, exposing a portion of the top surface of said second doped region; and forming a metal structure, with a first portion of said metal structure, overlying and contacting, the portion of said second doped region, exposed in said third opening, and with a second portion, of said metal structure, overlying the portion of said thin dielectric layer, in a region in which said thin dielectric layer resides on the top surface of said polysilicon floating gate structure.

2. The method of claim 1, wherein said first doped region, and said second doped region, are doped N type, via ion implantation of arsenic, or phosphorous ions, at an energy between about 30 to 100 KeV, at a dose between about 1E14 to 1E16 atoms/cm$^2$.

3. The method of claim 1, wherein said tunnel oxide layer, is a silicon dioxide layer, thermally grown in an oxygen-steam ambient, at a temperature between about 600 to 1000° C., to a thickness between about 60 to 150 Angstroms.

4. The method of claim 1, wherein said polysilicon floating gate structure, is patterned from a polysilicon layer, obtained using LPCVD procedures, at a thickness between about 500 to 4000 Angstroms, and either doped in situ, during deposition, via the addition of arsine, or phosphine, to a silane ambient, or deposited intrinsically and doped via an ion implantation procedure, using arsenic or phosphorous ions.

5. The method of claim 1, wherein said second insulator layer is a silicon oxide layer, obtained via LPCVD or PECVD procedures, at a thickness between about 3000 to 15000 Angstroms.

6. The method of claim 1, wherein said second opening, in said second insulator layer, is a capacitor opening, formed via an anisotropic RIE procedure, using $CHF_3$ as an etchant.

7. The method of claim 1, wherein said thin dielectric layer is a silicon oxide layer, or an ONO layer, formed at a thickness between about 100 to 1000 Angstroms.

8. The method of claim 1, wherein said metal structure is comprised of an aluminum based layer, obtained via R.F. sputtering, at a thickness between about 3000 to 10000 Angstroms, containing between about 0 to 3 weight % copper, and between about 0 to 1 weight % silicon.

9. A method of fabricating a single polysilicon, non-volatile memory device, on a semiconductor substrate, featuring a metal structure, used to contact a control gate region, located in said semiconductor substrate, and also used as an upper plate, of a capacitor structure, comprising the steps of;

forming isolation regions in said semiconductor substrate;

forming a first N type region, and forming a second N type region that used as said control gate region, in areas of said semiconductor substrate, not occupied by said isolation regions;

depositing a silicon oxide layer;

forming an opening in said silicon oxide layer, exposing a portion of the top surface of said first N type region;

thermally growing a silicon dioxide tunnel oxide layer, on the top surface of the portion of said first N type region, exposed in said opening in said silicon oxide layer;

depositing a polysilicon layer;

patterning of said polysilicon layer to create a polysilicon floating gate structure, overlying said silicon oxide tunnel layer, while also overlying a portion of said silicon oxide layer;

depositing an interlevel dielectric, (ILD), layer;

forming a capacitor opening, in said ILD layer, exposing a portion of the top surface of said polysilicon floating gate structure;

forming a capacitor dielectric layer on the exposed surfaces of said ILD layer, and on the portion of said polysilicon floating gate structure, exposed in said capacitor opening;

opening a contact hole in said capacitor dielectric layer, in said ILD layer, and in said silicon oxide layer, exposing a portion of the top surface of said control gate region;

depositing a metal layer; and patterning of said metal layer to create a metal structure, with a first region of said metal structure overlying and contacting the portion of said control gate region, exposed in said contact hole, and with a second region, of said metal structure, overlying said capacitor dielectric layer, in a region in which the capacitor dielectric layer resides on said polysilicon floating gate structure.

10. The method of claim 9, wherein said isolation regions are silicon oxide filled, shallow trench regions.

11. The method of claim 9, wherein said isolation regions are thermally grown, field oxide regions.

12. The method of claim 9, wherein said first N type region, and said second N type region, or control gate region, are formed via ion implantation of arsenic, or phosphorous ions, at an energy between about 10 to 100 KeV, at a dose between about 1E14 to 1E16 atoms/cm$^2$.

13. The method of claim 9, wherein said silicon dioxide tunnel oxide layer, is thermally grown in an oxygen-steam ambient, at a temperature between about 600 to 1000° C., to a thickness between about 60 to 150 Angstroms.

14. The method of claim 9, wherein said polysilicon layer is obtained via LPCVD procedures, at a thickness between about 500 to 4000 Angstroms, and either doped insitu, during deposition, via the addition of arsine, or phosphine, to a silane ambient, or doped via an ion implantation procedure, applied to an intrinsically grown, said polysilicon layer, using arsenic or phosphorous ions.

15. The method of claim 9, wherein said polysilicon floating gate structure is formed via anisotropic RIE procedures, using $Cl_2$ as an etchant, applied to said polysilicon layer.

16. The method of claim 9, wherein said ILD layer, is a silicon oxide layer, obtained via LPCVD or PECVD procedures, at a thickness between about 3000 to 15000 Angstroms.

17. The method of claim 9, wherein said capacitor opening is formed in said ILD layer, via an anisotropic RIE procedure, using $CHF_3$ as an etchant.

18. The method of claim 9, wherein said capacitor dielectric layer is a silicon oxide layer, or an ONO layer, at a thickness between about 100 to 1000 Angstroms.

19. The method of claim 9, wherein said metal structure is comprised of an aluminum based layer, obtained via R.F. sputtering, at a thickness between about 3000 to 10000 Angstroms, containing between about 0 to 3 weight % copper, and between about 0 to 1 weight % silicon.

* * * * *